(12) United States Patent
Steffen et al.

(10) Patent No.: US 11,714,127 B2
(45) Date of Patent: Aug. 1, 2023

(54) ON-CHIP SPREAD SPECTRUM CHARACTERIZATION

(71) Applicant: International Business Machines Corporation, Armonk, NY (US)

(72) Inventors: Christopher W. Steffen, Rochester, MN (US); John P. Borkenhagen, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 272 days.

(21) Appl. No.: 16/005,978

(22) Filed: Jun. 12, 2018

(65) Prior Publication Data

US 2019/0377026 A1 Dec. 12, 2019

(51) Int. Cl.
  *G01R 31/317* (2006.01)
  *G01R 29/26* (2006.01)
  (Continued)

(52) U.S. Cl.
  CPC ....... *G01R 31/31727* (2013.01); *G01R 29/26* (2013.01); *G01R 31/31709* (2013.01);
  (Continued)

(58) Field of Classification Search
  CPC ... H04L 2027/0065; H04L 1/205; H04L 7/04; H04W 16/14; G01R 29/26;
  (Continued)

(56) References Cited

U.S. PATENT DOCUMENTS

| 4,216,354 A | 8/1980 | Esteban et al. |
| 4,790,015 A | 12/1988 | Callens et al. |

(Continued)

FOREIGN PATENT DOCUMENTS

| WO | 0021237 A1 | 4/2000 |
| WO | 2001037428 A1 | 5/2001 |
| WO | 2021209850 A1 | 10/2021 |

OTHER PUBLICATIONS

Li et al., AC 2011-409: Measuring the Jitter of Clock Signal, American Society for Engineering Education, <<https://www.asee.org/public/conferences/1/papers/409/download>> (online), dated 2011, printed May 11, 2018, 12 pages.

(Continued)

*Primary Examiner* — April Y Blair
*Assistant Examiner* — Sazzad Hossain
(74) *Attorney, Agent, or Firm* — Nathan M. Rau

(57) ABSTRACT

On-chip spread spectrum characterization including obtaining, from a skitter circuit, skitter data comprising a spread width corresponding to an amplitude of a spread of a spread spectrum clock signal; setting an offset pointer to a center of the spread width corresponding to the amplitude of the spread; retrieving, for each of a number of reference clock cycles, edge data indicating a location, within the spread width, of an edge of the spread spectrum during the reference clock cycle; incrementing, using the edge data, an offset counter for each reference clock cycle during which the edge of the spread spectrum crosses the offset pointer; and calculating a frequency of the spread spectrum using the offset counter and the number of reference clock cycles.

20 Claims, 7 Drawing Sheets

(51) Int. Cl.
*G01R 31/319* (2006.01)
*G01R 31/28* (2006.01)
*H04W 16/14* (2009.01)
*H04L 1/20* (2006.01)
*H04L 7/04* (2006.01)
*H04L 27/00* (2006.01)

(52) U.S. Cl.
CPC .... *G01R 31/31922* (2013.01); *G01R 31/2822* (2013.01); *H04L 1/205* (2013.01); *H04L 7/04* (2013.01); *H04L 2027/0065* (2013.01); *H04W 16/14* (2013.01)

(58) Field of Classification Search
CPC ........ G01R 31/31709; G01R 31/31727; G01R 31/31922; G01R 31/2822
See application file for complete search history.

(56) References Cited

U.S. PATENT DOCUMENTS

| | | |
|---|---|---|
| 4,933,957 A | 6/1990 | Bottau et al. |
| 5,446,767 A | 8/1995 | Nakagawa et al. |
| 5,448,569 A | 9/1995 | Huang et al. |
| 5,507,035 A | 4/1996 | Bantz et al. |
| 5,515,366 A | 5/1996 | Chieu et al. |
| 5,533,025 A | 7/1996 | Fleek et al. |
| 5,757,870 A | 5/1998 | Miya et al. |
| 5,774,494 A | 6/1998 | Sawahashi et al. |
| 5,943,329 A | 8/1999 | Ohgoshi et al. |
| 6,011,546 A | 1/2000 | Bertram |
| 6,115,676 A | 9/2000 | Rector et al. |
| 6,175,860 B1 | 1/2001 | Gaucher |
| 6,243,413 B1 | 6/2001 | Beukema |
| 6,289,213 B1 | 9/2001 | Flint et al. |
| 6,292,507 B1 | 9/2001 | Hardin et al. |
| 6,314,128 B1 | 11/2001 | Bunker et al. |
| 6,393,049 B1 | 5/2002 | Davidovici et al. |
| 6,405,261 B1 | 6/2002 | Gaucher |
| 6,526,385 B1 | 2/2003 | Kobayashi et al. |
| 6,741,636 B1 | 5/2004 | Lender |
| 6,775,342 B1 | 8/2004 | Young et al. |
| 6,802,033 B1 | 10/2004 | Bertin et al. |
| 6,973,145 B1 | 12/2005 | Smith et al. |
| 7,043,206 B2 | 5/2006 | Herdey et al. |
| 7,050,478 B1 | 5/2006 | Weekly |
| 7,164,368 B1 | 1/2007 | Ireland |
| 7,187,705 B1 | 3/2007 | Richmond |
| 7,339,364 B2 | 3/2008 | Kam et al. |
| 7,389,095 B1* | 6/2008 | Liu .................. H04B 15/02 331/16 |
| 7,501,865 B1 | 3/2009 | Jacobowitz et al. |
| 7,742,556 B1 | 6/2010 | Qian et al. |
| 7,750,713 B2 | 7/2010 | Oh |
| 7,944,229 B2 | 5/2011 | Joshi et al. |
| 8,072,253 B2 | 12/2011 | Kaeriyama et al. |
| 8,090,888 B2 | 1/2012 | Milan et al. |
| 8,253,502 B2 | 8/2012 | Kanda |
| 8,284,816 B1 | 10/2012 | Clementi |
| 8,473,233 B1* | 6/2013 | Giust .............. G01R 31/31709 702/194 |
| 9,081,501 B2 | 7/2015 | Asaad et al. |
| 9,209,966 B1 | 12/2015 | Hossain et al. |
| 9,450,641 B2 | 9/2016 | Chung et al. |
| 9,639,114 B2 | 5/2017 | Shirai |
| 9,804,231 B2 | 10/2017 | Eckert et al. |
| 10,446,937 B2 | 10/2019 | Vannucci et al. |
| 10,466,289 B2 | 11/2019 | Lee et al. |
| 11,146,307 B1 | 10/2021 | Borkenhagen et al. |
| 17,506,172 | 10/2021 | Borkenhagen |
| 2001/0014114 A1 | 8/2001 | Baltersee et al. |
| 2001/0052871 A1 | 12/2001 | Fukae et al. |
| 2004/0095020 A1 | 5/2004 | Kernahan et al. |
| 2004/0095081 A1 | 5/2004 | Kernahan |
| 2004/0095108 A1 | 5/2004 | Kernahan et al. |
| 2004/0095112 A1 | 5/2004 | Kernahan et al. |
| 2004/0095116 A1 | 5/2004 | Kernahan et al. |
| 2004/0095164 A1 | 5/2004 | Kernahan et al. |
| 2004/0095264 A1 | 5/2004 | Thomas |
| 2004/0128591 A1 | 7/2004 | Ihs et al. |
| 2004/0257124 A1 | 12/2004 | Araki et al. |
| 2005/0013343 A1 | 1/2005 | Giunco et al. |
| 2007/0063755 A1 | 3/2007 | Gilliland |
| 2007/0091986 A1* | 4/2007 | Wu ..................... H04B 1/69 375/148 |
| 2007/0290894 A1 | 12/2007 | Ng et al. |
| 2008/0198945 A1 | 8/2008 | Egan et al. |
| 2008/0265957 A1 | 10/2008 | Luong et al. |
| 2009/0135885 A1 | 5/2009 | Lin |
| 2010/0027585 A1 | 2/2010 | Jeanson et al. |
| 2010/0061424 A1 | 3/2010 | Germann et al. |
| 2010/0090732 A1 | 4/2010 | Lee et al. |
| 2010/0166039 A1 | 7/2010 | Jeon et al. |
| 2010/0218042 A1 | 8/2010 | Milan et al. |
| 2011/0169582 A1* | 7/2011 | Kim .................... H03C 3/0916 331/1 R |
| 2011/0199138 A1 | 8/2011 | Sano |
| 2011/0219208 A1 | 9/2011 | Asaad et al. |
| 2013/0141076 A1 | 6/2013 | Zhang |
| 2013/0182747 A1 | 7/2013 | Nakamura et al. |
| 2014/0159787 A1* | 6/2014 | Hsu ..................... H03L 7/087 327/156 |
| 2014/0233744 A1 | 8/2014 | Risberg et al. |
| 2014/0269848 A1 | 9/2014 | Schrom et al. |
| 2015/0015426 A1 | 1/2015 | Lindahl et al. |
| 2016/0011996 A1 | 1/2016 | Asaad et al. |
| 2016/0182075 A1 | 6/2016 | Devarajan et al. |
| 2017/0033707 A1* | 2/2017 | Nishijima .............. H02M 7/06 |
| 2017/0286359 A1 | 10/2017 | McGowan |
| 2018/0069554 A1 | 3/2018 | Chen et al. |

OTHER PUBLICATIONS

IBM Appendix P, "List of IBM Patents or Patent Applications to be Treated as Related," Sep. 7, 2022, 2 pages.

International Search Report and Written Opinion, PCT/IB2021/052736, dated Jul. 8, 2021, 7 pages.

Tektronix, "Characterizing and Troubleshooting Jitter with Your Oscilloscope", Entest, Inc. (online), accessed Feb. 20, 2020, 14 pages, URL: http://www.entestinc.com/media/app-notes/55W-61099-0_TS-Jitter_AN_02.pdf.

U.S. Appl. No. 17/506,172, to John Borkenhagen et al., entitled On-Chip Spread Spectrum Synchronization Between Spread Spectrum Sources, assigned to international Business Machines Corporation, 47 pages, filed Oct. 20, 2021.

Zimmer et al., "Spread Spectrum Frequency Modulation Reduces EMI", Technical Article, Analog Devices, 5 pages, retrieved May 26, 2021 (online), URL: www.analog.com/media/en/technical-documentation/tech-articles/Spread-Spectrum-Frequency-Modulation-Reduces-EMI.pdf.

International Search Report and Written Opinion, PCT/EP2022/078318, dated Feb. 20, 2023, 12 pages.

* cited by examiner

ON-CHIP SPREAD SPECTRUM CHARACTERIZATION

BACKGROUND

Field of the Invention

The field of the invention is data processing, or, more specifically, methods, apparatus, and products for on-chip spread spectrum characterization.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for on-chip spread spectrum characterization are disclosed in this specification. On-chip spread spectrum characterization includes obtaining, from a skitter circuit, skitter data comprising a spread width corresponding to an amplitude of a spread of a spread spectrum clock signal; setting an offset pointer to a center of the spread width corresponding to the amplitude of the spread; retrieving, for each of a number of reference clock cycles, edge data indicating a location, within the spread width, of an edge of the spread spectrum during the reference clock cycle; incrementing, using the edge data, an offset counter for each reference clock cycle during which the edge of the spread spectrum crosses the offset pointer; and calculating a frequency of the spread spectrum using the offset counter and the number of reference clock cycles.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
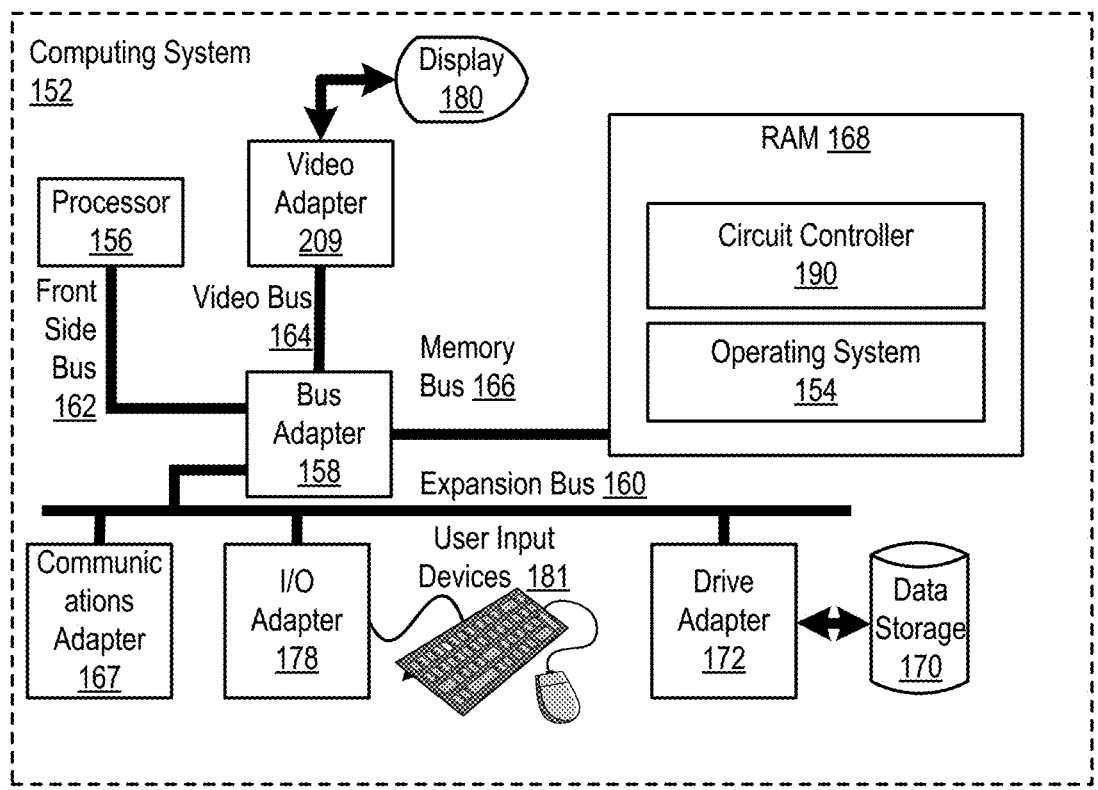
FIG. 1 sets forth a block diagram of an example system configured for on-chip spread spectrum characterization according to embodiments of the present invention.

Exemplary methods, apparatus, and products for on-chip spread spectrum characterization in accordance with the present invention are described with reference to the accompanying drawings, beginning with FIG. 1. FIG. 1 sets forth a block diagram of automated computing machinery comprising an exemplary computing system (152) configured for on-chip spread spectrum characterization according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for on-chip spread spectrum characterization according to embodiments of the present invention include UNIX™, Linux™, Microsoft Windows™, AIX™, IBM's i OS™, and others as will occur to those of skill in the art. The operating system (154) in the example of FIG. 1 is shown in RAM (168), but many components of such software typically are stored in non-volatile memory also, such as, for example, on data storage (170) such as a disk drive. Also stored in RAM is circuit controller (190), a module for on-chip spread spectrum characterization according to embodiments of the present invention.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for on-chip spread spectrum characterization according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for on-chip spread spectrum characterization according to embodiments of the present invention include modems for wired dial-up communications, Ethernet (IEEE 802.3) adapters for wired data communications, and 802.11 adapters for wireless data communications.

In some computing system designs, processors (such as processor (156)) include on-chip spread spectrum clocks. Within these processors, phase-locked loops (PLLs) are used to apply a spread spectrum to a clock signal. A spread spectrum is a deterministic frequency component added to the clock signal to distribute the power of the signal more evenly over a number of frequencies of the clock signal. As used herein, spread spectrum refers to both a deterministic spread spectrum signal intentionally added to a clock signal and a deterministic jitter unintentionally added to a clock signal.

Evaluating the on-chip spread spectrum clocks ensures the PLL health and stable clock grids. However, the on-chip generated spread spectrum clocks may be difficult to characterize. Specifically, once a clock signal has undergone the addition of a spread spectrum by a PLL, determining whether the addition of the spread spectrum was successful, and whether the spread spectrum clock signal is consistent with the intended effect of the PLL(s), may be difficult.

Figure 2:
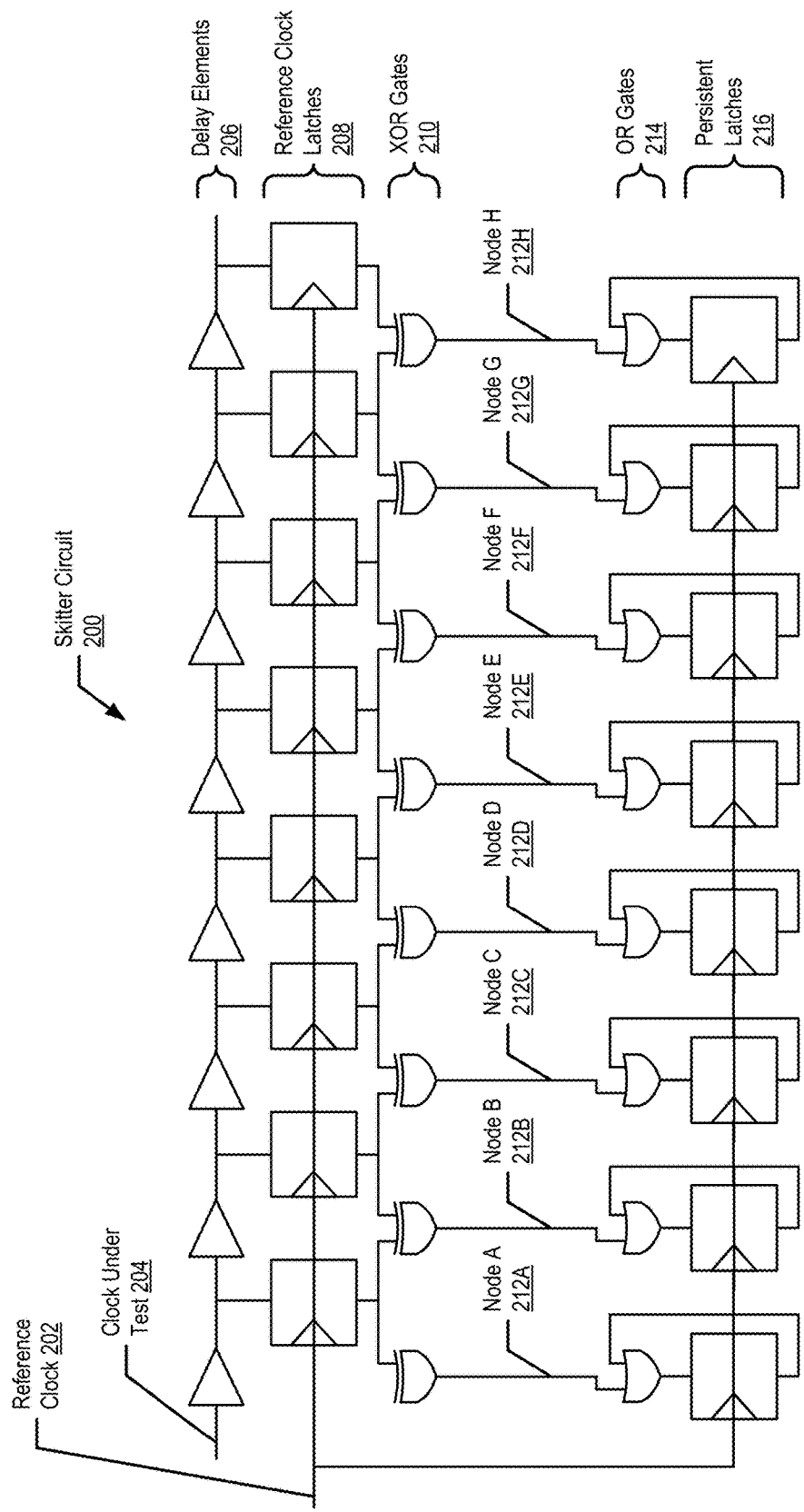
FIG. 2 sets forth a circuit diagram of an example system configured for on-chip spread spectrum characterization according to embodiments of the present invention.

FIG. 2 shows an exemplary circuit for on-chip spread spectrum characterization according to embodiments of the present invention. As shown in FIG. 2, the exemplary skitter circuit (200) includes a reference clock (202) line, a clock under test (204) line, delay elements (206), reference clock latches (208), exclusive OR (XOR) gates (210), OR gates (214), persistent latches (216), and a set of nodes (node A (212A), node B (212B), node C (212C), node D (212D), node E (212E), node F (212F), node G (212G), node H (212H)) between the XOR gates (210) and OR gates (214). Although a limited number of elements are shown in the exemplary skitter circuit (200) of FIG. 2, a skitter circuit may include elements sufficient to capture at least one period of the clock under test signal.

The reference clock (202) line is a signal line that carries a reference clock signal. The reference clock signal is the clock signal to which a clock under test signal is compared. The reference clock signal may be generated from an off-chip oscillator. The reference clock signal may be the clock signal before undergoing the addition of a spread spectrum by a PLL or being subjected to a process that causes the unintentional addition of jitter to the clock signal.

The clock under test (204) line is a signal line that carries a clock under test signal. The clock under test signal may be a spread spectrum clock signal. Specifically, the clock under test signal may be the result of a clock signal (such as the reference clock signal) undergoing the addition of a spread spectrum by a PLL. The clock under test signal may also be the result of a clock signal (such as the reference clock signal) being subjected to a process that causes the unintentional addition of jitter to the clock signal.

The delay elements (206) are circuits or components that receive the clock under test signal from the clock under test (204) line. The delay elements (206) delay the clock under test signal such that data corresponding to a portion of the clock under test signal may be captured by the reference clock latches (208).

The reference clock latches (208) store data corresponding to a portion of the clock under test signal measured during one reference clock cycle. After each reference clock cycle, the reference clock latches (208) store a snapshot of the clock under test signal during the reference clock cycle. Specifically, the reference clock latches (208) store data indicating whether the clock under test signal was high or low at each point within the series of delay elements (206). For example, after a first clock cycle, the reference clock latches (208) may store, cumulatively, '00011111'. After a second clock cycle, the reference clock latches (208) may store, cumulatively, '00111111'. After a third clock cycle, the reference clock latches (208) may store, cumulatively, '01111111'.

The XOR gates (210) are used to locate an edge of the clock under test signal for each reference clock cycle. The XOR gates (210) compare the data stored in each reference clock latch (208) to the neighboring reference clock latch (208) to determine whether the data has shifted from high to low or low to high. Using the example above, after the first reference clock cycle, the XOR gates (210) may output, cumulatively, '00010000'. After the second reference clock cycle, the XOR gates (210) may output, cumulatively, '00100000'. After the third reference clock cycle, the XOR gates (210) may output, cumulatively, '01000000'.

The OR gates (214) and the persistent latches (216) continuously store all high signals received during the set of reference clock cycles. Using the example above, after the first reference clock cycle, the persistent latches (216) store, cumulatively, '00010000'. After the second reference clock cycle, the persistent latches (216) store, cumulatively, '00110000'. After the third reference clock cycle, the persistent latches (216) store, cumulatively, '01110000'.

After a number of reference clock cycles is allowed to run, OR gates (214) and the persistent latches (216) store skitter data. Skitter data is a collection of data describing the spread spectrum of a spread spectrum clock signal. Specifically, skitter data includes a spread width that corresponds to an amplitude of a spread of a spread spectrum clock signal. Continuing with the above example, the skitter data produced after the third clock cycle is '01110000'. This example skitter data includes a spread width of three high signals. Using the spread width of three high signals, the amplitude may be calculated by multiplying the spread width by the buffer delay of the delay elements.

The set of nodes (node A (212A), node B (212B), node C (212C), node D (212D), node E (212E), node F (212F), node G (212G), node H (212H)) between the XOR gates (210) and OR gates (214) are points within the skitter circuit (200) from which edge data may be gathered from the skitter circuit (200). The edge data indicates a relative location of the edge of the clock under test during a reference clock cycle. If the clock under test signal is a spread spectrum clock signal, the edge data indicates a location, within the spread width, of an edge of the spread spectrum during the reference clock cycle.

The set of nodes may be used to capture the output of the XOR gates (210) in order to store data corresponding to the relative location of the edge of the clock under test during each reference clock cycle. As discussed in the example above, after the first reference clock cycle, the set of nodes may be used to capture, cumulatively, '00010000'. After the second reference clock cycle, the set of nodes may be used to capture, cumulatively, '00100000'. After the third reference clock cycle, the set of nodes may be used to capture, cumulatively, '01000000'.

Each edge data may be retrieved from the skitter circuit for a single clock cycle. Specifically, each unit of edge data refers to a collection of data retrieved during a single reference clock cycle (in contrast to skitter data that is a collection of data retrieved after multiple reference clock cycles). Edge data may refer to data for a single reference clock cycle retrieved from the set of nodes (node A (212A), node B (212B), node C (212C), node D (212D), node E (212E), node F (212F), node G (212G), node H (212H)) within the skitter circuit (200).

Figure 3:
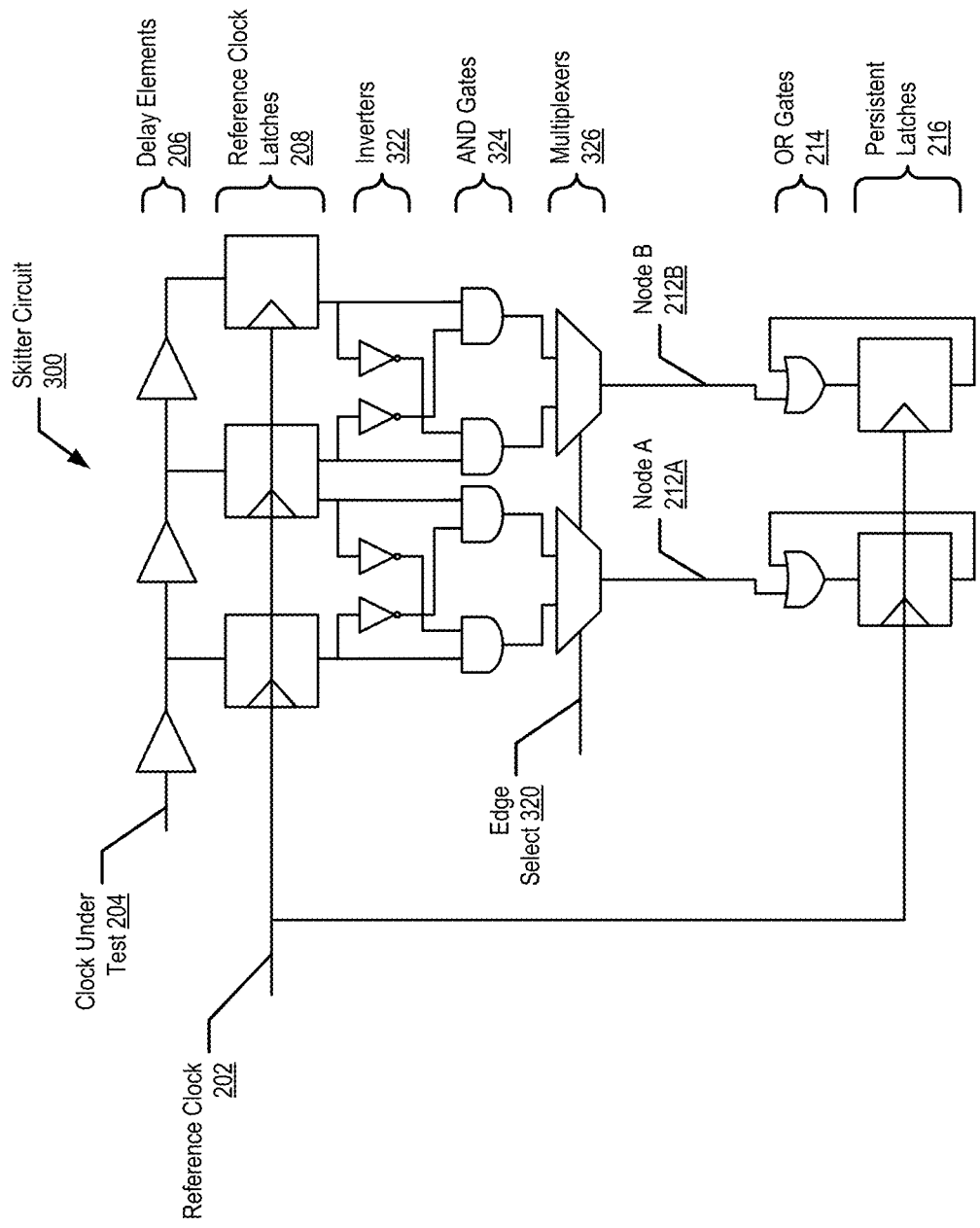
FIG. 3 sets forth a circuit diagram of an example system configured for single edge detection of on-chip spread spectrum characterization according to embodiments of the present invention.

FIG. 3 shows an exemplary circuit for on-chip spread spectrum characterization according to embodiments of the present invention. As shown in FIG. 3, the exemplary skitter circuit (300) includes a reference clock (202) line, a clock under test (204) line, delay elements (206), reference clock latches (208), OR gates (214), persistent latches (216), and node A (212A) between a multiplexer (326) and the OR gates (214).

The exemplary skitter circuit (300) of FIG. 3 differs from the exemplary skitter circuit (200) of FIG. 2 in that the skitter circuit (300) of FIG. 3 includes inverters (322), AND gates (324), a multiplexer (326) and an edge select (320) line. The skitter circuit (300) of FIG. 3 is a specialized version of the skitter circuit (200) of FIG. 2 configured to detect either only the rising edge of the signal on the clock under test (204) line (excluding the falling edge) or only the falling edge of the signal on the clock under test (204) line (excluding the rising edge).

The inverters (322) provide the inverse of the signal stored in each reference clock latch (208) for comparison to the signal stored in each adjacent reference clock latch (208). The AND gates (324) compare the signal in each reference clock latch (208) to the inverse of the signal stored in the adjacent reference clock latch (208). The multiplexers (326) and edge select (320) line select between the AND gate (324) results. Specifically, the multiplexers (326) and edge select (320) line select between an AND gate detecting whether the current reference clock latch signal is high and the previous reference clock latch (208) signal is low, and an AND gate detecting weather the current reference clock latch signal is high and the next reference clock latch (208) signal is low. The edge select (320) line selects between the results of the different AND gates (324).

For example, if the edge select (320) line is enabled for rising edges, the signal at node A (212A) may only go high upon a detection that a low signal is stored in the first reference clock latch (208) and a high signal is stored in the second reference clock latch (208). Similarly, if the edge select (320) line is enabled for falling edges, the signal at node A (212A) may only go high upon a detection that a high signal is stored in the first reference clock latch (208) and a low signal is stored in the second reference clock latch (208).

The edge data read from the nodes (node A (212A), node B (212B)) in the skitter circuit (300) of FIG. 3, dependent on the edge select (320) line, may indicate either only the rising edge of the spread spectrum during the reference clock cycle or only the falling edge of the spread spectrum during the reference clock cycle.

Figure 4:
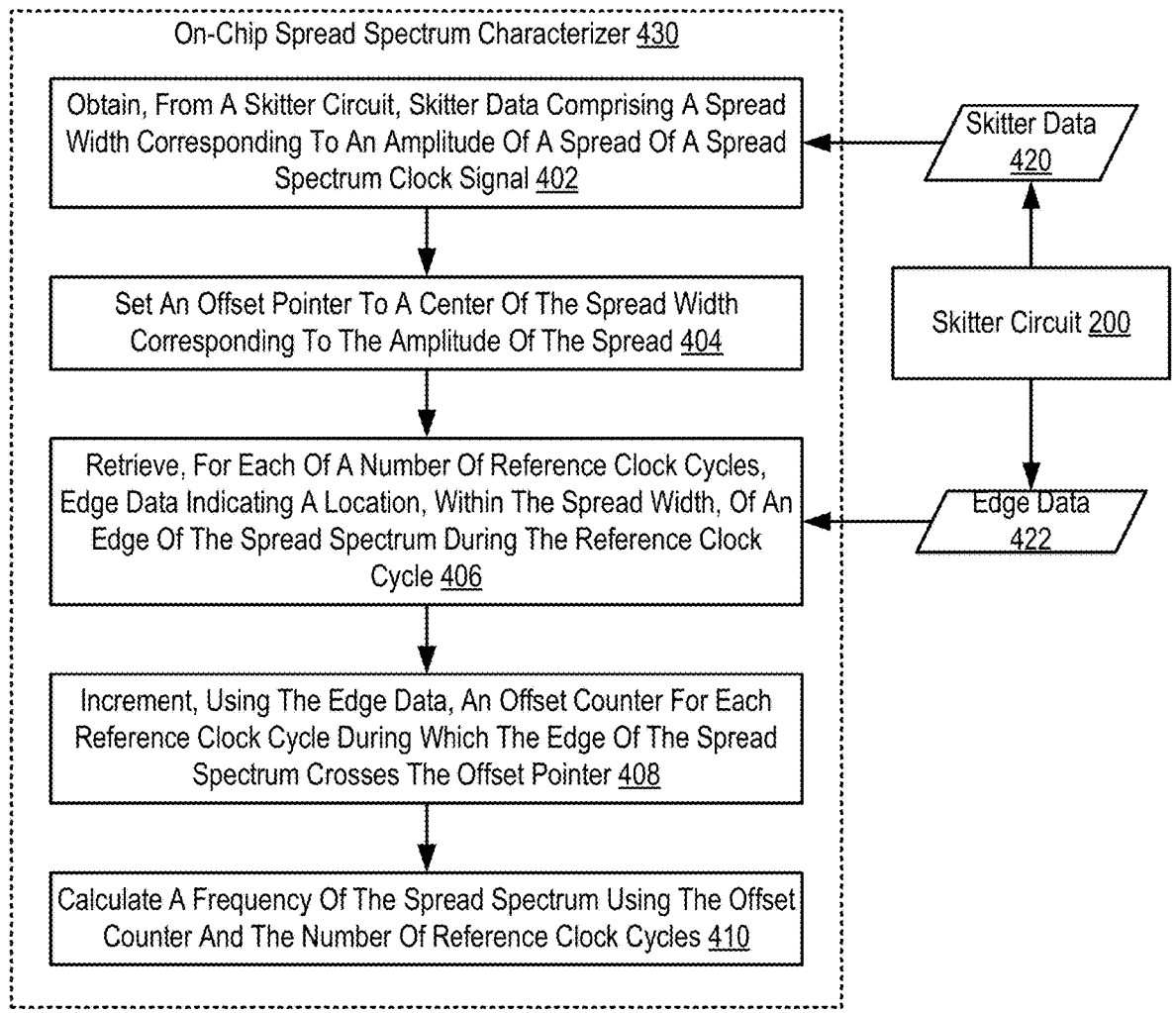
FIG. 4 sets forth a flow chart illustrating an exemplary method for on-chip spread spectrum characterization according to embodiments of the present invention.

For further explanation, FIG. 4 sets forth a flow chart illustrating an exemplary method for on-chip spread spectrum characterization according to embodiments of the present invention that includes obtaining (402), from a skitter circuit (200), skitter data (420) comprising a spread width corresponding to an amplitude of a spread of a spread spectrum clock signal. Obtaining (402), from a skitter circuit (200), skitter data (420) comprising a spread width corresponding to an amplitude of a spread of a spread spectrum clock signal may be carried out by an on-chip spread spectrum characterizer (430) reading or otherwise retrieving the skitter data (420) from the persistent latches of the skitter circuit (200). The skitter data (420) may be obtained after a group (i.e., a plurality) of consecutive reference clock cycles have elapsed and data for each of the reference clock cycles has been captured by the skitter circuit (200), processed by the elements of the skitter circuit (200), and stored as skitter data in the persistent latches of the skitter circuit (200). The skitter circuit (200) may be a modified skitter circuit as described in FIG. 2 or FIG. 3. Specifically, the skitter circuit (200) may include nodes from which edge data may be read.

The skitter data (420) may be stored in a circuit separate from the skitter circuit (200) configured for on-chip spread spectrum characterizing. Such a circuit may be located on the same integrated circuit as the skitter circuit (200). Alternatively, the skitter data (420) may be retrieved from the integrated circuit using firmware and stored in a software data structure on the computing system.

The method of FIG. 4 further includes setting (404) an offset pointer to a center of the spread width corresponding to the amplitude of the spread. Setting (404) an offset pointer to a center of the spread width corresponding to the amplitude of the spread may be carried out by the on-chip spread spectrum characterizer (430) locating a center point of the spread width and recording the location as the offset pointer. The offset pointer represents the axis around which an edge of the spread spectrum oscillates.

For example, a skitter circuit (200) may generate the skitter data '011111111000' stored in a group of 12 persistent latches after a group of reference clock cycles. The spread width (corresponding to the amplitude of the spread) is the eight high signals that begin after the first low signal in the example skitter data. In this example, the offset pointer is set after the first four high signals in the center of spread width.

The method of FIG. 4 further includes retrieving (406), for each of a number of reference clock cycles, edge data (422) indicating a location, within the spread width, of an edge of the spread spectrum during the reference clock cycle. Retrieving (406), for each of a number of reference clock cycles, edge data (422) indicating a location, within the spread width, of an edge of the spread spectrum during the reference clock cycle may be carried out by the on-chip spread spectrum characterizer (430) reading, after each of the number of reference clock cycles, edge data (422) from the edge data nodes within the skitter circuit (200). The number of reference clock cycles during which the edge data is collected may be during the same clock cycles, previous clock cycles, or subsequent clock cycles to the clock cycles during which the skitter data (420) is obtained.

For example, during 21 reference clock cycles, the on-chip spread spectrum characterizer (430) may retrieve 21 sets of edge data as in the example shown in Table 1:

TABLE 1

| Reference Clock Cycle | Skitter Data: | | | | | | | | | | |
|---|---|---|---|---|---|---|---|---|---|---|---|
| | | | | | 1 Offset Pointer | 1 Edge Data | | | | | |
| | 0 | 1 | 1 | 1 | 1 | 1 | 1 | 1 | 0 | 0 | 0 |
| 0 | 0 | 0 | 1 | 0 | 0 | 0 | 0 | 0 | 0 | 0 | 0 |
| 1 | 0 | 0 | 0 | 1 | 0 | 0 | 0 | 0 | 0 | 0 | 0 |
| 2 | 0 | 0 | 0 | 0 | 1 | 0 | 0 | 0 | 0 | 0 | 0 |
| 3 | 0 | 0 | 0 | 0 | 0 | 1 | 0 | 0 | 0 | 0 | 0 |
| 4 | 0 | 0 | 0 | 0 | 0 | 0 | 1 | 0 | 0 | 0 | 0 |
| 5 | 0 | 0 | 0 | 0 | 0 | 0 | 0 | 1 | 0 | 0 | 0 |
| 6 | 0 | 0 | 0 | 0 | 0 | 0 | 0 | 1 | 0 | 0 | 0 |
| 7 | 0 | 0 | 0 | 0 | 0 | 0 | 1 | 0 | 0 | 0 | 0 |
| 8 | 0 | 0 | 0 | 0 | 0 | 1 | 0 | 0 | 0 | 0 | 0 |
| 9 | 0 | 0 | 0 | 0 | 1 | 0 | 0 | 0 | 0 | 0 | 0 |
| 10 | 0 | 0 | 0 | 1 | 0 | 0 | 0 | 0 | 0 | 0 | 0 |
| 11 | 0 | 0 | 0 | 1 | 0 | 0 | 0 | 0 | 0 | 0 | 0 |
| 12 | 0 | 0 | 1 | 0 | 0 | 0 | 0 | 0 | 0 | 0 | 0 |
| 13 | 0 | 1 | 0 | 0 | 0 | 0 | 0 | 0 | 0 | 0 | 0 |
| 14 | 0 | 0 | 1 | 0 | 0 | 0 | 0 | 0 | 0 | 0 | 0 |
| 15 | 0 | 0 | 0 | 1 | 0 | 0 | 0 | 0 | 0 | 0 | 0 |
| 16 | 0 | 0 | 0 | 0 | 1 | 0 | 0 | 0 | 0 | 0 | 0 |
| 17 | 0 | 0 | 0 | 0 | 0 | 1 | 0 | 0 | 0 | 0 | 0 |
| 18 | 0 | 0 | 0 | 0 | 0 | 0 | 1 | 0 | 0 | 0 | 0 |
| 19 | 0 | 0 | 0 | 0 | 0 | 0 | 0 | 1 | 0 | 0 | 0 |
| 20 | 0 | 0 | 0 | 0 | 0 | 0 | 0 | 1 | 0 | 0 | 0 |

Table 1 also shows the example skitter data (420) and example offset pointer for reference.

Retrieving (406), for each of a number of reference clock cycles, edge data (422) indicating a location, within the spread width, of an edge of the spread spectrum during the reference clock cycle may include retrieving, for each of the number of reference clock cycles, rising edge data indicating the location, within the spread width, of only the rising edge of the spread spectrum during the reference clock cycle. Similarly, retrieving (406), for each of a number of reference clock cycles, edge data (422) indicating a location, within the spread width, of an edge of the spread spectrum during the reference clock cycle may include retrieving, for each of the number of reference clock cycles, falling edge data indicating the location, within the spread width, of only the falling edge of the spread spectrum during the reference clock cycle. Retrieving only the rising edge or only the falling edge may be used by a skitter circuit (200) modified as in the exemplary skitter circuit (300) of FIG. 3.

The method of FIG. 4 further includes incrementing (408), using the edge data (422), an offset counter for each reference clock cycle during which the edge of the spread spectrum crosses the offset pointer. Incrementing (408), using the edge data (422), an offset counter for each reference clock cycle during which the edge of the spread spectrum crosses the offset pointer may be carried out by the on-chip spread spectrum characterizer (430) determining whether the edge of the spread spectrum, as indicated in the edge data, crosses the offset pointer during any two consecutive reference clock cycles.

Continuing with the example of Table 1, the offset pointer is set between the fifth and sixth location in the edge data. Between reference clock cycle 2 and reference clock cycle 3, the edge crosses the offset pointer and the offset counter is incremented from 0 to 1. Between reference clock cycle 9 and reference clock cycle 10, the edge crosses the offset pointer and the offset counter is incremented from 1 to 2.

Between reference clock cycle 16 and reference clock cycle 17, the edge crosses the offset pointer and the offset counter is incremented from 2 to 3.

The method of FIG. 4 further includes calculating (410) a frequency of the spread spectrum using the offset counter and the number of reference clock cycles. Calculating (410) a frequency of the spread spectrum using the offset counter and the number of reference clock cycles may be carried out by the on-chip spread spectrum characterizer (430) applying a formula to the offset counter and the number of reference clock cycles to determine the frequency of the spread spectrum. The following formula may be used to calculate the frequency of the spread spectrum using the offset counter, the number of reference clock cycles, and the period of the reference clock:

$$\text{Frequency} = \frac{\text{offset counter}}{(\text{number of reference clock cycles}) * (\text{period of the reference clock})}$$

Continuing with the example of Table 1, over 21 reference clock cycles, the offset pointer was incremented 3 times. Therefore, the frequency of the spread spectrum in the example is calculated as:

$$\text{Frequency} = \frac{3}{21 * (\text{period of the reference clock})}$$

The on-chip spread spectrum characterizer (430) may be a circuit on the same integrated circuit as the skitter circuit (200). The on-chip spread spectrum characterizer (430) may include circuits to store data such as the skitter data and edge data and circuits to obtain (402), from a skitter circuit (200), skitter data (420) comprising a spread width corresponding to an amplitude of a spread of a spread spectrum clock signal; set (404) an offset pointer to a center of the spread width corresponding to the amplitude of the spread; retrieve (406), for each of a number of reference clock cycles, edge data (422) indicating a location, within the spread width, of an edge of the spread spectrum during the reference clock cycle; increment (408), using the edge data (422), an offset counter for each reference clock cycle during which the edge of the spread spectrum crosses the offset pointer; and calculate (410) a frequency of the spread spectrum using the offset counter and the number of reference clock cycles. Alternatively, the on-chip spread spectrum characterizer (430) may be a software circuit controller that interacts with elements on the integrated circuit via firmware.

The limitations described above improve the operation of the computer system by verifying that the addition, by a PLL, of the spread spectrum was successful, and whether the spread spectrum clock signal is consistent with the intended effect of the PLL(s). This is accomplished by evaluating the spread spectrum using skitter data, extracting edge data from a skitter circuit, and determining a frequency of the spread spectrum using the skitter data and the edge data, including setting an offset pointer to a center of the spread width corresponding to the amplitude of the spread; retrieving, for each of a number of reference clock cycles, edge data (422) indicating a location, within the spread width, of an edge of the spread spectrum during the reference clock cycle; incrementing, using the edge data (422), an offset counter for each reference clock cycle during which the edge of the spread spectrum crosses the offset pointer; and calculating the frequency of the spread spectrum using the offset counter and the number of reference clock cycles.

Figure 5:
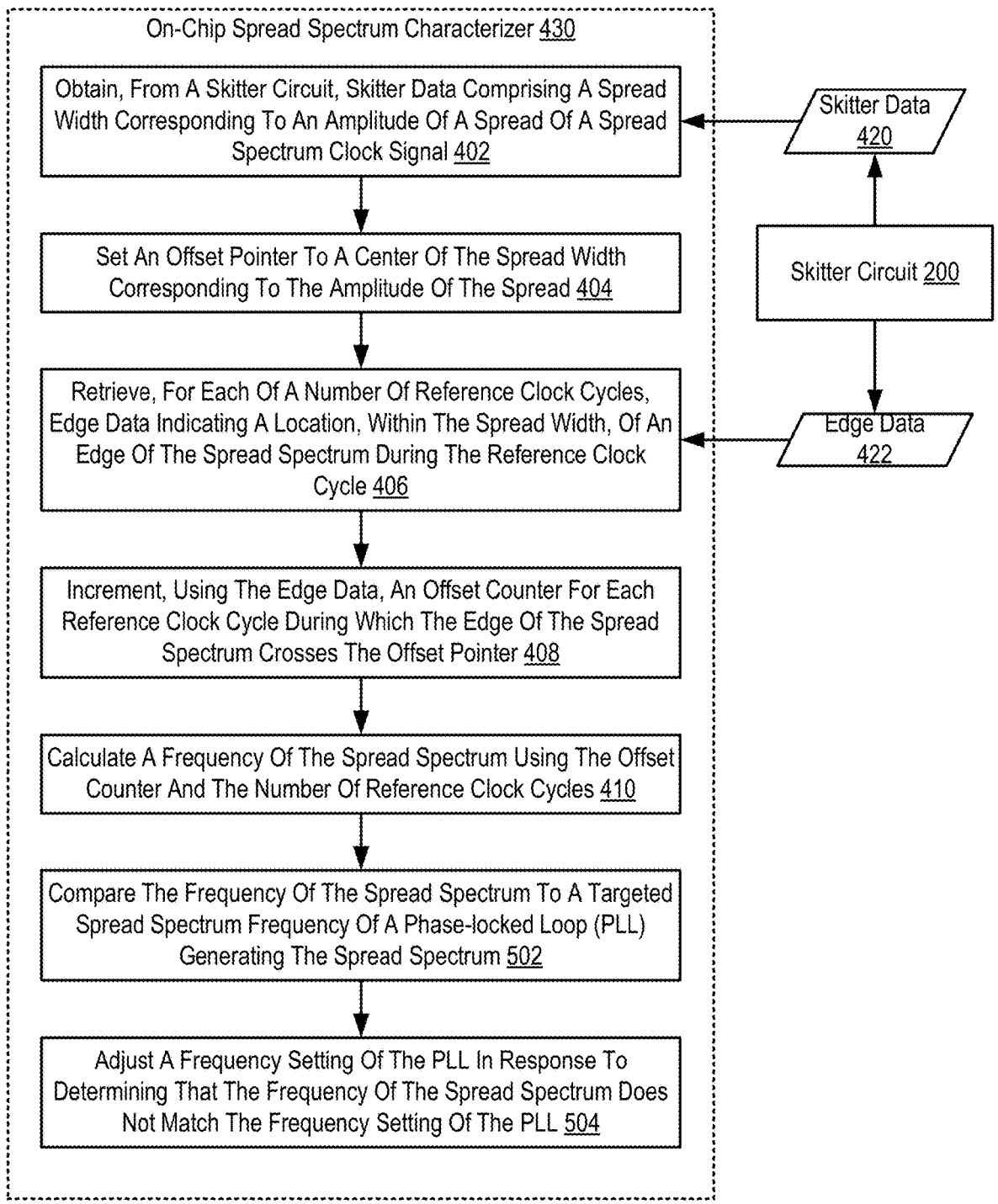
FIG. 5 sets forth a flow chart illustrating an exemplary method for on-chip spread spectrum characterization according to embodiments of the present invention.

For further explanation, FIG. 5 sets forth a flow chart illustrating a further exemplary method for on-chip spread spectrum characterization according to embodiments of the present invention that includes obtaining (402), from a skitter circuit (200), skitter data (420) comprising a spread width corresponding to an amplitude of a spread of a spread spectrum clock signal; setting (404) an offset pointer to a center of the spread width corresponding to the amplitude of the spread; retrieving (406), for each of a number of reference clock cycles, edge data (422) indicating a location, within the spread width, of an edge of the spread spectrum during the reference clock cycle; incrementing (408), using the edge data (422), an offset counter for each reference clock cycle during which the edge of the spread spectrum crosses the offset pointer; and calculating (410) a frequency of the spread spectrum using the offset counter and the number of reference clock cycles.

The method of FIG. 5 differs from the method of FIG. 4, however, in that the method of FIG. 5 further includes comparing (502) the frequency of the spread spectrum to a targeted spread spectrum frequency of a phase-locked loop (PLL) generating the spread spectrum; and adjusting (504) a frequency setting of the PLL in response to determining that the frequency of the spread spectrum does not match the targeted spread spectrum frequency of the PLL.

Comparing (502) the frequency of the spread spectrum to a targeted spread spectrum frequency of a phase-locked loop (PLL) generating the spread spectrum may be carried out by the on-chip spread spectrum characterizer (430) determining whether the frequency of the spread spectrum matches (e.g., is within a threshold tolerance of) the targeted spread spectrum frequency of the PLLs that applied the spread spectrum. The targeted spread spectrum frequency of the PLL generating the spread spectrum may be a frequency at which the PLL was designed or configured to output the spread spectrum of the spread spectrum clock signal. The targeted spread spectrum frequency of the PLL may be retrieved from the PLL itself or from a storage location on the integrated circuit or communicatively attached to the integrated circuit.

For example, the targeted spread spectrum frequency of the PLL generating the spread spectrum may indicate that the PLL is configured to apply a spread spectrum of 40 kilohertz to the reference clock signal. However, the frequency of the spread spectrum as calculated by the on-chip spread spectrum characterizer (430) may be 35 kilohertz. Assuming a threshold tolerance of 3 kilohertz, the on-chip spread spectrum characterizer (430) may determine that the frequency of the spread spectrum does not match the targeted spread spectrum frequency of the PLLs that applied the spread spectrum.

Adjusting (504) a frequency setting of the PLL in response to determining that the frequency of the spread spectrum does not match the targeted spread spectrum frequency of the PLL may be carried out by the on-chip spread spectrum characterizer (430) sending a signal to the PLL to change the frequency settings affecting the spread spectrum clock signal output by the PLL. Adjusting (504) a frequency setting of the PLL may be an automatic response to determining that the frequency of the spread spectrum does not match the targeted spread spectrum frequency of the PLL.

Adjusting (504) a frequency setting of the PLL in response to determining that the frequency of the spread spectrum does not match the targeted spread spectrum frequency of the PLL may include reconfiguring, by the on-chip spread spectrum characterizer (430), the frequency setting of the PLL based on the targeted spread spectrum frequency of the PLL and the frequency of the spread spectrum as calculated by the on-chip spread spectrum characterizer (430). The on-chip spread spectrum characterizer (430) may configure the frequency setting of the PLL to generate an increased frequency spread spectrum if the frequency of the spread spectrum as calculated by the on-chip spread spectrum characterizer (430) is lower than the targeted spread spectrum frequency of the PLL. Similarly, the on-chip spread spectrum characterizer (430) may configure the frequency setting of the PLL to generate a decreased frequency spread spectrum if the frequency of the spread spectrum as calculated by the on-chip spread spectrum characterizer (430) is higher than the targeted spread spectrum frequency of the PLL.

Figure 6:
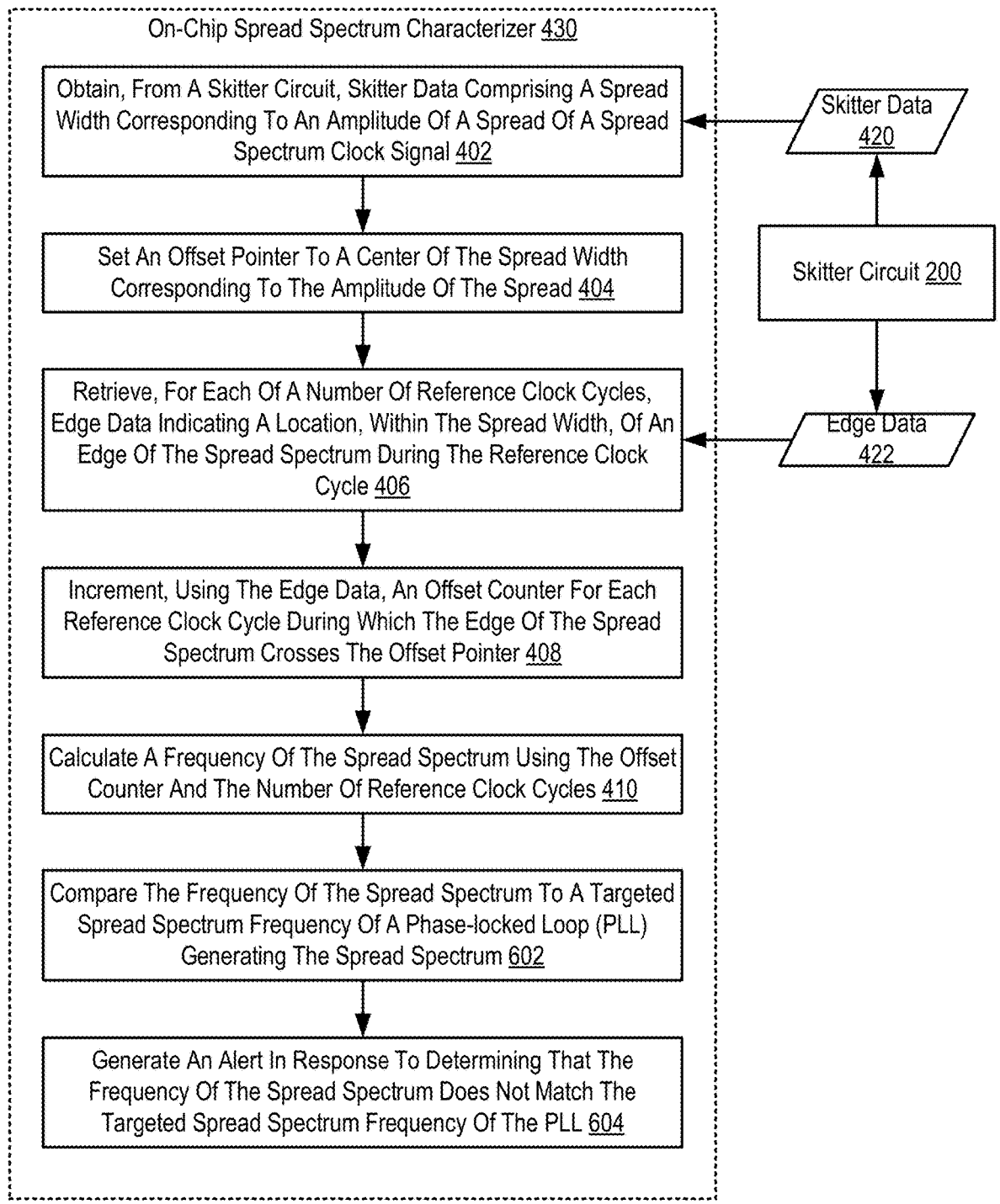
FIG. 6 sets forth a flow chart illustrating an exemplary method for on-chip spread spectrum characterization according to embodiments of the present invention.

For further explanation, FIG. 6 sets forth a flow chart illustrating a further exemplary method for on-chip spread spectrum characterization according to embodiments of the present invention that includes obtaining (402), from a skitter circuit (200), skitter data (420) comprising a spread width corresponding to an amplitude of a spread of a spread spectrum clock signal; setting (404) an offset pointer to a center of the spread width corresponding to the amplitude of the spread; retrieving (406), for each of a number of reference clock cycles, edge data (422) indicating a location, within the spread width, of an edge of the spread spectrum during the reference clock cycle; incrementing (408), using the edge data (422), an offset counter for each reference clock cycle during which the edge of the spread spectrum crosses the offset pointer; and calculating (410) a frequency of the spread spectrum using the offset counter and the number of reference clock cycles.

The method of FIG. 6 differs from the method of FIG. 4, however, in that the method of FIG. 6 further includes comparing (602) the frequency of the spread spectrum to a targeted spread spectrum frequency of a phase-locked loop (PLL) generating the spread spectrum; and generating (604) an alert in response to determining that the frequency of the spread spectrum does not match the targeted spread spectrum frequency of the PLL.

Comparing (602) the frequency of the spread spectrum to a targeted spread spectrum frequency of a phase-locked loop (PLL) generating the spread spectrum may be carried out by the on-chip spread spectrum characterizer (430) determining whether the frequency of the spread spectrum matches (e.g., is within a threshold tolerance of) the targeted spread spectrum frequency of the PLL that applied the spread spectrum.

Generating (604) an alert in response to determining that the frequency of the spread spectrum does not match the targeted spread spectrum frequency of the PLL may be carried out by the on-chip spread spectrum characterizer (430) creating a message to inform an entity internal or external to the integrated circuit that the frequency of the spread spectrum does not match the targeted spread spectrum frequency of the PLL. The alert may be sent to an entity on the integrated circuit that tracks errors within the integrated circuit. The alert may be sent to an entity on the integrated circuit capable of remedying the mismatch between the frequency of the spread spectrum and the targeted spread spectrum frequency of the PLL. The alert may be sent to a circuit controller external to the integrated circuit and executing on the computing system, which may in turn inform a user that the frequency of the spread spectrum does not match the targeted spread spectrum frequency of the PLL.

Figure 7:
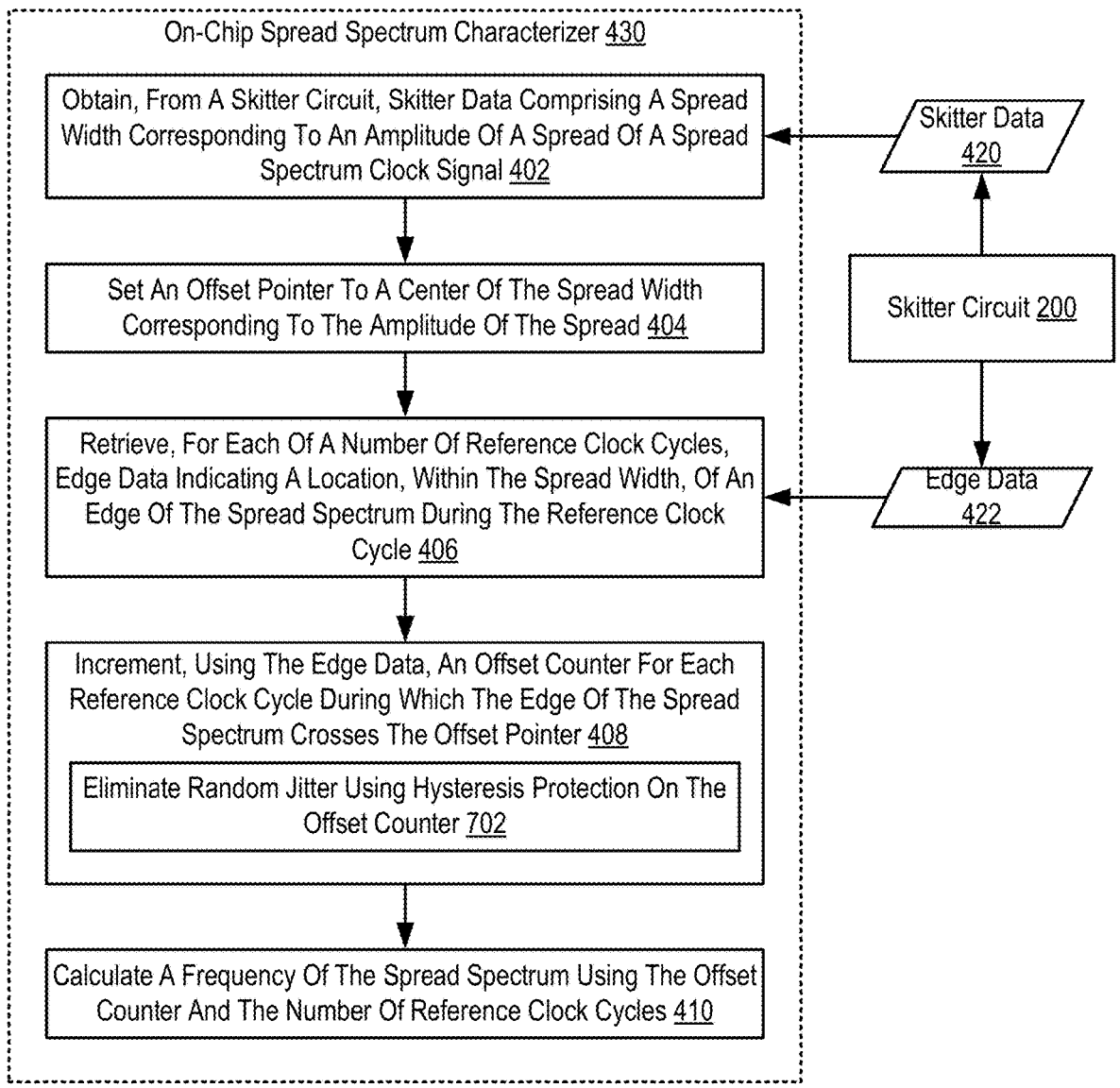
FIG. 7 sets forth a flow chart illustrating an exemplary method for on-chip spread spectrum characterization according to embodiments of the present invention.

For further explanation, FIG. 7 sets forth a flow chart illustrating a further exemplary method for on-chip spread spectrum characterization according to embodiments of the present invention that includes obtaining (402), from a skitter circuit (200), skitter data (420) comprising a spread width corresponding to an amplitude of a spread of a spread spectrum clock signal; setting (404) an offset pointer to a center of the spread width corresponding to the amplitude of the spread; retrieving (406), for each of a number of reference clock cycles, edge data (422) indicating a location, within the spread width, of an edge of the spread spectrum during the reference clock cycle; incrementing (408), using the edge data (422), an offset counter for each reference clock cycle during which the edge of the spread spectrum crosses the offset pointer; and calculating (410) a frequency of the spread spectrum using the offset counter and the number of reference clock cycles.

The method of FIG. 7 differs from the method of FIG. 4, however, in that incrementing (408), using the edge data (422), an offset counter for each reference clock cycle during which the edge of the spread spectrum crosses the offset pointer includes eliminating (702) random jitter using hysteresis protection on the offset counter. Eliminating (702) random jitter using hysteresis protection on the offset counter may be carried out by the on-chip spread spectrum characterizer (430) verifying that the edge does not cross the offset pointer within a certain number of reference clock cycles. The certain number of reference clock cycles may be based on the number of reference clock cycles between the previous two or more crossings of the offset pointer.

For example, assume that the on-chip spread spectrum characterizer (430) measures eight reference clock cycles between each of the first five crossings of the offset pointer. If the sixth crossing of the offset pointer occurs after only two reference clock cycles, then the on-chip spread spectrum characterizer (430) may disregard the sixth crossing of the offset pointer by preventing the offset counter from incrementing in response to the sixth offset pointer crossing.

In view of the explanations set forth above, readers will recognize that the benefits of on-chip spread spectrum characterization according to embodiments of the present invention include:
  Improving the operation of a computing system by verifying that the addition, by a PLL, of the spread spectrum to a clock signal was successful, increasing computing system reliability.
  Improving the operation of a computing system by determining whether the spread spectrum clock signal is consistent with the intended effect of the PLL, increasing computing system reliability.

Exemplary embodiments of the present invention are described largely in the context of a fully functional computer system for on-chip spread spectrum characterization. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of on-chip spread spectrum characterization, the method comprising:
    obtaining, from a skitter circuit, skitter data comprising a spread width corresponding to an amplitude of a spread of a spread spectrum clock signal;
    setting an offset pointer to a center of the spread width corresponding to the amplitude of the spread;
    retrieving, for each of a number of reference clock cycles, edge data indicating a location, within the spread width, of an edge of the spread spectrum during the reference clock cycle;
    determining, over two consecutive reference clock cycles, a number of times the edge of the spread spectrum crossed the center of the spread width;
    incrementing, using the edge data, an offset counter once, based on the two consecutive reference clock cycles, for each time the edge of the spread spectrum crosses the center of the spread width; and
    calculating a frequency of the spread spectrum using the offset counter and the number of reference clock cycles.

2. The method of claim 1, further comprising:
    comparing the frequency of the spread spectrum to a targeted spread spectrum frequency of a phase-locked loop (PLL) generating the spread spectrum; and
    adjusting a frequency setting of the PLL in response to determining that the frequency of the spread spectrum does not match the targeted spread spectrum frequency of the PLL.

3. The method of claim 1, further comprising:
    comparing the frequency of the spread spectrum to a targeted spread spectrum frequency of a phase-locked loop (PLL) generating the spread spectrum; and
    generating an alert in response to determining that the frequency of the spread spectrum does not match the targeted spread spectrum frequency of the PLL.

4. The method of claim 1, wherein the edge data is retrieved from the skitter circuit for a single clock cycle.

5. The method of claim 1, wherein incrementing the offset counter for each reference clock cycle during which the edge of the spread spectrum crosses the offset pointer comprises eliminating random jitter using hysteresis protection on the offset counter, and wherein the edge data, for each of the reference clock cycles, is based on a set of three or more edge data nodes, wherein each edge data node is a point within the skitter circuit for determining the location, within the spread width, of an edge of the spread spectrum during the reference clock cycle.

6. The method of claim 1, wherein retrieving, for each of the number of reference clock cycles, the edge data indicating the location, within the spread width, of the edge of the spread spectrum during the reference clock cycle comprises one selected from a group consisting of:
    retrieving, for each of the number of reference clock cycles, rising edge data indicating the location, within the spread width, of only the rising edge of the spread spectrum during the reference clock cycle; and retrieving, for each of the number of reference clock cycles, falling edge data indicating the location, within the spread width, of only the falling edge of the spread spectrum during the reference clock cycle.

7. The method of claim 1, wherein the spread spectrum is one selected from a group consisting of a deterministic spread spectrum intentionally added to the spread spectrum clock signal by a phase-locked loop (PLL) and a deterministic jitter unintentionally added to the spread spectrum clock signal by the PLL.

8. An integrated circuit for on-chip spread spectrum characterization, the integrated circuit configured to carry out the steps of:
  obtaining, from a skitter circuit, skitter data comprising a spread width corresponding to an amplitude of a spread of a spread spectrum clock signal;
  setting an offset pointer to a center of the spread width corresponding to the amplitude of the spread;
  retrieving, for each of a number of reference clock cycles, edge data indicating a location, within the spread width, of an edge of the spread spectrum during the reference clock cycle;
  determining, over two consecutive reference clock cycles, a number of times the edge of the spread spectrum crossed the center of the spread width;
  incrementing, using the edge data, an offset counter once, based on the two consecutive reference clock cycles, for each time the edge of the spread spectrum crosses the center of the spread width; and
  calculating a frequency of the spread spectrum using the offset counter and the number of reference clock cycles.

9. The integrated circuit of claim 8, wherein the integrated circuit is further configured to carry out the steps of:
  comparing the frequency of the spread spectrum to a targeted spread spectrum frequency of a phase-locked loop (PLL) generating the spread spectrum; and
  adjusting a frequency setting of the PLL in response to determining that the frequency of the spread spectrum does not match the targeted spread spectrum frequency of the PLL.

10. The integrated circuit of claim 8, wherein the integrated circuit is further configured to carry out the steps of:
  comparing the frequency of the spread spectrum to a targeted spread spectrum frequency of a phase-locked loop (PLL) generating the spread spectrum; and
  generating an alert in response to determining that the frequency of the spread spectrum does not match the targeted spread spectrum frequency of the PLL.

11. The integrated circuit of claim 8, wherein the edge data is retrieved from the skitter circuit for a single clock cycle.

12. The integrated circuit of claim 8, wherein incrementing the offset counter for each reference clock cycle during which the edge of the spread spectrum crosses the offset pointer comprises eliminating random jitter using hysteresis protection on the offset counter.

13. The integrated circuit of claim 8, wherein retrieving, for each of the number of reference clock cycles, the edge data indicating the location, within the spread width, of the edge of the spread spectrum during the reference clock cycle comprises one selected from a group consisting of:
  retrieving, for each of the number of reference clock cycles, rising edge data indicating the location, within the spread width, of only the rising edge of the spread spectrum during the reference clock cycle; and
  retrieving, for each of the number of reference clock cycles, falling edge data indicating the location, within the spread width, of only the falling edge of the spread spectrum during the reference clock cycle.

14. The integrated circuit of claim 8, wherein the spread spectrum is one selected from a group consisting of a deterministic spread spectrum intentionally added to the spread spectrum clock signal by a phase-locked loop (PLL) and a deterministic jitter unintentionally added to the spread spectrum clock signal by the PLL.

15. A computer program product for on-chip spread spectrum characterization, the computer program product disposed upon a non-transitory computer readable medium, the computer program product comprising computer program instructions that, when executed, cause a computer to carry out the steps of:
  obtaining, from a skitter circuit, skitter data comprising a spread width corresponding to an amplitude of a spread of a spread spectrum clock signal;
  setting an offset pointer to a center of the spread width corresponding to the amplitude of the spread;
  retrieving, for each of a number of reference clock cycles, edge data indicating a location, within the spread width, of an edge of the spread spectrum during the reference clock cycle;
  determining, over two consecutive reference clock cycles, a number of times the edge of the spread spectrum crossed the center of the spread width;
  incrementing, using the edge data, an offset counter once, based on the two consecutive reference clock cycles, for each time the edge of the spread spectrum crosses is located at the center of the spread width; and
  calculating a frequency of the spread spectrum using the offset counter and the number of reference clock cycles.

16. The computer program product of claim 15, wherein the computer program instructions, when executed, further cause the computer to carry out the steps of:
  comparing the frequency of the spread spectrum to a targeted spread spectrum frequency of a phase-locked loop (PLL) generating the spread spectrum; and
  adjusting a frequency setting of the PLL in response to determining that the frequency of the spread spectrum does not match the targeted spread spectrum frequency of the PLL.

17. The computer program product of claim 15, wherein the computer program instructions, when executed, further cause the computer to carry out the steps of:
  comparing the frequency of the spread spectrum to a targeted spread spectrum frequency of a phase-locked loop (PLL) generating the spread spectrum; and
  generating an alert in response to determining that the frequency of the spread spectrum does not match the targeted spread spectrum frequency of the PLL.

18. The computer program product of claim 15, wherein the edge data is retrieved from the skitter circuit for a single clock cycle.

19. The computer program product of claim 15, wherein incrementing the offset counter for each reference clock cycle during which the edge of the spread spectrum crosses the offset pointer comprises eliminating random jitter using hysteresis protection on the offset counter.

20. The computer program product of claim 15, wherein retrieving, for each of the number of reference clock cycles, the edge data indicating the location, within the spread width, of the edge of the spread spectrum during the reference clock cycle comprises one selected from a group consisting of:
  retrieving, for each of the number of reference clock cycles, rising edge data indicating the location, within the spread width, of only the rising edge of the spread spectrum during the reference clock cycle; and retrieving, for each of the number of reference clock cycles, falling edge data indicating the location, within the spread width, of only the falling edge of the spread spectrum during the reference clock cycle.

\* \* \* \* \*